United States Patent

Brunson et al.

(10) Patent No.: US 7,501,815 B2
(45) Date of Patent: Mar. 10, 2009

(54) COMBINED MAGNETIC FIELD GRADIENT AND MAGNETIC FIELD STRENGTH SENSOR

(75) Inventors: Kevin M Brunson, Worcestershire (GB); David O King, Worcestershire (GB)

(73) Assignee: QinetiQ Limited, London (GB)

( * ) Notice: Subject to any disclaimer, the term of this patent is extended or adjusted under 35 U.S.C. 154(b) by 151 days.

(21) Appl. No.: 10/581,308

(22) PCT Filed: Dec. 16, 2004

(86) PCT No.: PCT/GB2004/005267

§ 371 (c)(1),
(2), (4) Date: Jun. 2, 2006

(87) PCT Pub. No.: WO2005/062064

PCT Pub. Date: Jul. 7, 2005

(65) Prior Publication Data

US 2007/0096729 A1    May 3, 2007

(30) Foreign Application Priority Data

Dec. 24, 2003  (GB)  ................. 0329959.1

(51) Int. Cl.
*G01R 33/02* (2006.01)
(52) U.S. Cl. .............. 324/244; 324/259; 33/355 R
(58) Field of Classification Search ......... 324/244–260; 33/355 R, 356, 352
See application file for complete search history.

(56) References Cited

U.S. PATENT DOCUMENTS

| 3,614,490 | A | | 10/1971 | Soredal |
| 3,906,360 | A | * | 9/1975 | Soredal et al. ............. 324/256 |
| 5,920,012 | A | * | 7/1999 | Pinson .................. 73/504.12 |
| 5,959,452 | A | * | 9/1999 | Givens et al. ............... 324/260 |
| 6,275,034 | B1 | | 8/2001 | Tran et al. |
| 6,486,665 | B1 | * | 11/2002 | Funk et al. ................ 324/260 |
| 6,819,103 | B2 | * | 11/2004 | Champion et al. .......... 324/260 |
| 2006/0181273 | A1 | * | 8/2006 | Greywall et al. ............ 324/256 |

FOREIGN PATENT DOCUMENTS

WO        00/68702        11/2000

OTHER PUBLICATIONS

International Search Report of PCT/GB2004/005267, mailed Apr. 12, 2005.
GB Search Report of GB0329959.1, dated Apr. 23, 2004.
Emmerich et al., "Magnetic Field Measurements with a Novel Surface Micromachined Magnetic-Field Sensor", IEEE Transactions on Electron Devices, vol. 47, No. 5, May 2000, pp. 972-977, XP000928618.

* cited by examiner

*Primary Examiner*—Jay M Patidar
(74) *Attorney, Agent, or Firm*—Nixon & Vanderhye P.C.

(57) ABSTRACT

A magnetic field sensor device (2) is described that comprises an oscillatory member (8) and current control means (6). The current control means (6) is arranged to pass an alternating current (AC) along at least first (10) and second (12) current paths provided through the oscillatory member (8) and is arranged to provide magnetic gradiometer mode operation (i.e. to measure magnetic field gradient) in which current flow through the first current path (10) is in substantially the opposite direction to current flow through the second current path (12). The current control means (6) can also prove magnetometer mode operation (i.e. to measure magnetic field strength). The magnetic field sensor (2) may be used in a compass.

36 Claims, 4 Drawing Sheets

COMBINED MAGNETIC FIELD GRADIENT AND MAGNETIC FIELD STRENGTH SENSOR

This application is the U.S. national phase of international application PCT/GB2004/005267, filed 16 Dec. 2005, which designated the U.S. and claims priority of GB 0329959.1, filed 24 Dec. 2003, the entire contents of each of which are hereby incorporated by reference.

The present invention relates to a magnetic field sensor, and more particularly to a combined magnetic field gradient and magnetic field strength sensor for use in compasses and the like.

A number of magnetic field strength sensors, also termed magnetometers, are known. Typically, such sensors are configured to measure magnetic field strength along one axis. For compass applications, three magnetometers may be used to measure magnetic field strength along three mutually orthogonal axes allowing the direction of the Earth's magnetic field to be uniquely determined and thus providing a compass bearing.

An example of a compact MEMS based resonant magnetometer is described by D. K. Wickenden et al in the paper "MEMS based resonating Xylophone Bar Magnetometers", SPIE Conference Proceedings—Micro-machined Devices and Components IV, SPIE Vol. 3514, pp 350-358, 1998. The Wickenden et al device comprises a surface micro-machined bar that is fixed to a pair of electrodes at the nodes of its first resonant mode. In use, an alternating current (AC) is passed through the bar at the resonant frequency of the bar. In the presence of a magnetic field, the Lorenz force causes the bar to resonate and the magnitude of any such movement is sensed capacitively to provide an indication of the strength of the applied magnetic field.

A variation to the basic MEMS resonant magnetometer design has recently been described by Zaki Izham, Michael CL Ward, Kevin M Brunson and Paul C Stevens in the paper entitled "Development of a Resonant Magnetometer"; see Proceedings of the 2003 Nanotechnology Conference and Trade show, February 23-27, San Francisco, Volume 1, pp 340-343, ISBN 0-9728422-0-9. The Izham et al resonant magnetometer is formed from a silicon-on-insulator (SOI) wafer and comprises a oscillatory mass having two sets of fixed-fixed suspensions that allow it to move along an axis in the plane of the wafer. An AC current having a frequency around the resonant frequency of the oscillatory mass is passed along a current path of the suspension thereby causing the mass to resonate in the presence of a magnetic field. A set of electrodes are attached to the mass to allow the magnitude of any magnetic field induced movement to be measured capacitively.

As the Earth's magnetic field is relatively weak it is well known that the accuracy of compasses, including magnetometer based devices, can be significantly reduced in the presence of localised magnetic fields. Localised magnetic field can arise from many different sources, such as electrical devices, electrical cables or magnetic materials. To increase compass accuracy, calibration procedures have previously been adopted in which pairs of magnets are located around the compass in positions that counteract the localised magnetic field. Although this technique works for fixed compass installations (e.g. on a vehicle or a ship) it can not be easily applied to mobile (e.g. hand-held) compass systems.

Magnetic field gradient sensors, often termed magnetic gradiometers, are also known. Magnetic gradiometers typically comprise a pair of magnetometers spatially separated by several meters and any difference in magnetic field strength measured by the two magnetometers is used to determine the magnetic field gradient. In this manner, minute magnetic field gradients have previously been measured to a high degree of accuracy.

It is an object of the present invention to provide a magnetic field sensor, and in particular a magnetic field sensor for use in a compass, that mitigates at least some of the above mentioned disadvantages.

According to a first aspect of the present invention, a magnetic field sensor device comprises an oscillatory member and current control means, wherein the current control means is arranged to pass an alternating current (AC) along at least first and second current paths provided through the oscillatory member, characterised in that the current control means is arranged to provide magnetic gradiometer mode operation in which current flow through the first current path is in substantially the opposite direction to current flow through the second current path.

The magnetic field sensor of the present invention thus comprises an oscillatory member which is subjected to oscillatory forces arising from the Lorentz interaction of any applied magnetic field with the AC current that passes along the first and second current paths. The current control means is arranged such that, in gradiometer mode, the current flow direction through the first current path is substantially opposed to the current flow direction through the second current path. In other words, the AC current (which obviously has a current flow direction that alters periodically with time) is applied to the first and second current paths in a manner that ensures any currents passing along the first and second current path will be flowing in opposite directions with respect to the oscillatory member. The AC current passed through the first current paths could thus be considered to be out of phase with the current passed through the second current path.

If it is assumed that the alternating current flowing through the first and second current paths is of equal amplitude, and that the first and second current paths are substantially the same length, any difference in magnetic field intensity at the first and second current paths will impart a resultant oscillatory force to the oscillatory member that is related to the magnetic field gradient. If no magnetic field gradient is present (e.g. the device is in a substantially uniform magnetic field or there is no magnetic field present) no resultant force will be imparted to the oscillatory member of the device. A magnetic field sensor is thus provided in which a resultant Lorentz oscillatory force is imparted to the oscillatory member that is dependent on the difference in magnetic field strength at the two current paths.

The device of the present invention thus provides a compact magnetic gradiometer. The provision of a single oscillatory member having two separate current paths provides greater sensitivity to magnetic field gradients than would be possible using two discrete spatially separated magnetometer devices. Alternatively, the increased sensitivity of the device of the present invention can be used to reduce the physical size required to provide a magnetic gradiometer of a given sensitivity.

It should be noted that the term current path as used herein means a conductive route through the oscillatory member. Typically, the conductive route forming the current path through the oscillatory member will be electrically connected to an underlying substrate at two connection points (e.g. via physical anchor points that attach the oscillatory member to a substrate). A current can then be passed along the current path by application of a suitable potential difference across the connection points. It should be noted that the current path may be a straight conductive track directly linking the connection points, or a more complex conductive pattern may be used to define the current path; for example, the current path may be curved or pass through stress relief portions as described in more below. The current path may be formed from layers buried within the oscillatory member or from layers located on a surface of the oscillatory member.

Conveniently, the current control means is arranged to additionally provide magnetometer mode operation in which current flow through the first current path is in substantially the same direction as current flow through the second current path. In this mode, the oscillatory force imparted to the oscillatory member by the interaction of the magnetic field and current flow through the first current path adds to the oscillatory force imparted to the oscillatory member by the interaction of the magnetic field and current flow through the second current path. This allows magnetic field strength to be measured. The provision of first and second current paths can be used to increase the total current flow through the oscillatory member.

Alternatively, a magnetometer mode of operation may advantageously be used in which the current control means passes an AC through only the first current path. The device will then operate in the same manner as a magnetometer of the type described in our International patent application PCT/GB2004/004017.

Advantageously, the current control means comprises a mode selector for switching the device to either one of gradiometer mode and magnetometer mode as required. The mode selector may comprise, for example, a cross-over switch or other electronic or electrical circuitry to reverse the current flow direction along either the first current path or the second current path.

Advantageously, the device further comprises sensing means that provide an output signal dependent on the deflection of the oscillatory member. The sensing means may conveniently comprise at least one sensor electrode located on the substrate and having a variable capacitance with the oscillatory member. In other words, the sensing means measures movement of the oscillatory member via capacitative pickup.

Preferably, the sensing means comprises a plurality of elongate sensor electrodes located on the substrate and the oscillatory member comprises a plurality of elongate electrodes interdigitated with said plurality of elongate sensor electrodes. The interdigitated sets of electrodes provide the required capacitance variation with oscillatory member movement. To allow movement direction to be determined, the skilled person would appreciate that each elongate sensor electrode could be conveniently located closer to one of the pair of oscillatory member elongate electrodes that are adjacent thereto.

Conveniently, the electrodes of the oscillatory member are maintained at a predetermined direct current (DC) polarisation voltage. In such a case, the capacitance between the electrodes of the oscillatory member and substrate can be measured directly.

Alternatively, a high frequency AC polarisation voltage (or so-called probe signal) may advantageously be applied to the electrodes of the oscillatory member. The use of a high frequency probe signal ensures the 1/f noise of the amplifying electronics do not significant affect the quality of the capacitive pick off. This frequency is also well above the mechanical response of the vibrating structure. Preferably, the high frequency probe signal is within the range of 50 KHz to many tens of MHz, more preferably it is greater than 100 KHz and even more preferably it is around 1 MHz. Implementing high frequency capacitive pick-up thus improves the signal to noise ratio of the output electrical signal produced by the sensing means.

Advantageously, the plurality of sensor electrodes are electrically connected to form two electrode sets, the two electrode sets being arranged to provide differential capacitive pick-off. As described in more detail below, the movement induced capacitive signals provided by each electrode set can be arranged such that they are out of phase. However, the feed-through from the drive circuits in the signal produced by each electrode set will always be in-phase. Hence, subtracting the signals (i.e. determining the signal difference) will reduce noise effects and provide a cleaner movement induced signal. This differential capacitive pick-off provides an output electrical signal with significantly lower noise levels than can be obtained using direct pick-off.

Advantageously, driving means are also provided to impart a magnetic field independent oscillatory force to the oscillatory member. Preferably, the magnetic field independent oscillatory force has a magnitude that is sufficient to ensure that, during use, the oscillatory member is continually forced into resonance. The oscillatory member will thus oscillate with an amplitude related to the resultant of the magnetic field independent oscillatory force and any Lorentz forces imparted by the interaction of the magnetic field with the AC passing through the first and second current paths of the oscillatory member.

In this manner, a magnetic field sensor device is provided in which an oscillatory member is driven into resonance by the combination of magnetic field dependent (i.e. Lorentz) oscillatory forces and a magnetic field independent oscillatory force that is applied by the driving means. The oscillatory member is thus driven into resonance even in the absence of an applied magnetic field (magnetometer mode) or a magnetic field gradient (gradiometer mode). On application of a magnetic field (magnetometer mode) or a magnetic field gradient (gradiometer mode), the amplitude of oscillation of the oscillatory member will alter in a detectable manner.

Ensuring the oscillatory member is continually driven to resonance by providing the driving means provides several advantages over oscillatory magetometer devices that are only driven to resonance on the application of a magnetic field. Firstly, continuous measurement of the resonant frequency of the oscillatory member is possible allowing the frequency of the applied AC to appropriately selected. This is especially advantageous where the device is to be used in a variety of different environments that produce a marked change in resonant properties (e.g. different temperatures, pressures etc). This should be contrasted to prior art magnetometers of the type described by Izham et al in which a measurement of resonant frequency is only possible when a magnetic field is applied that is sufficiently strong to initiate oscillation. Furthermore, the use of a driving means provides a device that typically has a lower magnetic field detection threshold; for example, in the magnetometer mode of operation a small magnetic field may be insufficient to initiate resonance of a static oscillatory member yet impart a sufficient Lorentz force to produce a measurable alteration in the amplitude of an oscillating oscillatory member.

It should be noted that the Lorentz force produced by the interaction of the AC with the magnetic field and the oscillatory force provided by the driving means are preferably arranged to be in-phase or out-of-phase. In such cases, the amplitude of oscillation of the oscillatory member will increase or decrease, depending on magnetic field direction or the sign of magnetic field gradient as the case may be, in the presence of an applied magnetic field. It would also be recognised by the skilled person that the magnetic field direction (magnetometer mode) and the sign of magnetic field gradient (gradiometer mode) can be readily determined from whether the amplitude of oscillation increases or decreases.

Advantageously, the oscillatory member is carried on a substrate and the driving means comprises at least one drive electrode formed on the substrate to electrostatically impart the oscillatory force to the oscillatory member.

Conveniently, the driving means comprises a plurality of first elongate drive electrodes formed on the substrate and the oscillatory member comprises a plurality of second elongate drive electrodes, wherein the first elongate drive electrodes are interdigitated with the second elongate drive electrodes. In other words, an electrostatic comb drive arrangement is implemented. The provision of such a comb drive decreases the dependence of the applied electrostatic force on the displacement of the oscillatory member and thus reduces any distortion in the movement of the oscillatory member. Although electrostatic based driving means are preferred, thermal or piezo-electric driving means may alternatively or additionally be used.

Conveniently, the driving means comprises a positive feedback circuit for receiving the electrical signal produced by the sensing means. The driving means is thus arranged to drive the oscillatory member into resonance using a positive feedback loop; the signal produced by the sensing means is appropriately processed (e.g. amplified and/or phase shifted as required) by the positive feedback circuit and used by the driving means to produce (e.g. electrostatically) an oscillatory force. This ensures that the driving means continually applies an oscillatory force to the oscillatory member at the resonant frequency thereof. In other words, there could be said to be self-resonant driving of the oscillatory member by the driving means. It should also be noted that the mechanical noise inherent to the device and the electrical noise inherent to the driving circuit has been found to be sufficient to initiate resonance on device start-up.

Preferably, the driving means provides an oscillatory force of fixed amplitude. In other words, the driving means works in the so-called "constant drive mode" and imparts a constant oscillatory force (e.g. by application of a constant amplitude AC drive voltage to electrostatic drive electrodes) to the oscillatory member. In the absence of a magnetic field when operating in magnetometer mode, or in the absence of a magnetic field gradient when operating in gradiometer mode, there is no resultant Lorentz force and the oscillatory member will oscillate with a constant amplitude. However, any resultant Lorentz force will alter the amplitude of oscillation of the oscillatory member by an amount directly related to the magnetic field strength.

Alternatively, the driving means is arranged to impart an oscillatory force to the oscillatory member of adjustable amplitude, wherein the amplitude of the oscillatory force is adjusted during use so as to maintain a given amplitude of oscillation of the oscillatory member. In other words, the driving means could be arranged so that the magnetometer works in the so-called "constant amplitude mode"; the oscillatory force imparted by the driving means being sufficient to ensure the oscillatory member resonates with a certain fixed amplitude. Application of a magnetic field or a magnetic field gradient, for magnetometer and gradiometer modes respectively, will result in the driving means altering the amplitude of the oscillatory force that is applied in order to maintain the fixed amplitude of oscillatory member resonance. In this case, the amplitude of the oscillatory force applied by the driving means provides a measure of the magnetic field intensity or magnetic field gradient as appropriate.

Advantageously, the frequency of the AC passed through the oscillatory member by the current control means is substantially equal to the resonant frequency of the oscillatory member. In this manner, resonant amplification of any oscillatory forces is maximized.

Advantageously, the current control means comprises a voltage source for supplying the AC passed through the oscillatory member. Although the AC passed through each current path of the oscillatory member could be provided by independent voltage sources, it is preferred that the AC passed along each current path is derived from a single source. The current control means may also be arranged such that the amplitude of AC passed through the first and second current paths is controllable. Controlling the amplitude of the AC applied to the oscillatory member allows the sensitivity of the device to be adjusted. For a given magnetic field strength or magnetic field gradient, increasing the applied AC will increase the amplitude of the Lorentz oscillatory force thereby increasing the magnetic field induced effect on the amplitude of the oscillatory member. If driving means are provided, the amplitude of the applied AC may also be reduced to zero to enable the resonant properties of the oscillatory member to be assessed without any magnetic field induced influence. This allows the quality factor Q to be measured for calibration purposes.

Advantageously, the current control means comprises a feedback circuit arranged to receive the output signal produced by the sensing means. A feedback loop (which may include appropriate amplification etc) is thus provided for generating the AC current that is passed through the current paths of the oscillatory member. As the AC current is derived directly from the oscillation of the oscillatory member, it has a frequency that will always be equal to the resonant frequency thereof. There is thus no requirement to provide a separate oscillator source to generate the AC current, and the phase-locked loop arrangements used in prior art magnetometers to ensure the AC frequency tracks the resonant frequency of the oscillatory member are not required. The resulting device is thus less complex, and cheaper to fabricate, than prior art devices.

It should be noted that providing feedback loops to control both the driving means and to produce the AC passed through the oscillatory member ensures that the magnetic field independent forces are appropriately phased with respect to the forces produced by the interaction of the magnetic field and the AC. This further increases the accuracy of magnetic field strength measurement.

Advantageously, the first and second current paths of the oscillatory member comprise substantially straight conductive tracks and preferably the conductive track forming the first current path is substantially parallel to the conductive path forming the second current path. Furthermore, it is advantageous for the length of the first current path through the oscillatory member to be substantially equal to the length of the second current path through the oscillatory member.

Advantageously, the first current path through the oscillatory member is spatially separated from the second current path through the oscillatory member by more than 5 mm or more preferably by more than 10 mm or more preferably by more than 20 mm. The greater the separation between the current paths, the greater the sensitivity to magnetic field gradients when the device operates in gradiometer mode. A skilled person would thus be able to select the separation required to provide a device of a required sensitivity.

Conveniently, the oscillatory member comprises at least first and second flexible leg portions, the first leg portion comprising a conductive portion defining the first current path and the second leg portion comprising a conductive portion defining the second current path. The oscillatory member may also advantageously comprise a substantially rigid cross-beam, a first end of the crossbeam being attached to the first flexible leg portion and the second end of the crossbeam being attached to the second flexible leg portion. Conveniently, one or more elongate electrodes protrude from the cross-beam. Such electrodes may be used to provide capacitative pick-off electrodes and/or to provide a counter electrode for the drive electrodes.

Advantageously, one or more additional flexible leg portions may be attached to the crossbeam. The additional flexible leg portions provide additional mechanical support to the beam and are particularly advantageous when the separation of the first and second legs portions is large. The one or more additional flexible leg portions may also comprise conductive portions; these may also be electrically connected to the cross beam and are preferably held at the required polarisation voltage as described below.

The cross beam may also be maintained at a given (D.C.) polarisation voltage during use. For example, the cross beam may comprise a conductive track that makes electrical contact with the midpoints of the conductive portions of the first and second leg portions. If a polarisation voltage (V) plus $\Delta V$ is applied to one end of a leg portion, whilst the polarisation voltage (V) minus $\Delta V$ is applied to the other end of a leg portion, the mid point of the leg portion and hence the cross-beam will be held at the polarisation voltage V. This applies irrespective of the direction of current flow through the current path of the leg portion and hence the cross-beam can be held at the required polarisation voltage when the device operates in magnetometer or gradiometer modes. It should be noted that an alternating $\Delta V$ can be applied such that the required AC current flows through the leg portions of the oscillatory member whilst the cross-beam is held at the desired D.C. polarisation voltage.

It is preferred that the oscillatory member comprises at least one stress relief means, such as a stress relief loop. The current path (e.g. the first or second current path) may thus comprise the conductive portion or portions of a stress relief loop as described in more detail with reference to FIG. 4 below. However, the current path through the stress relief means is typically negligible compared to the total current path length and is thus ignored when determining the direction of current flow along a current path. The provision of stress relief means reduces buckling and non-linear resonance effects that may occur when a suspended oscillatory member is anchored to a substrate.

Advantageously, the device is formed as a micro-electro-mechanical system (MEMS). Herein the term "micro-electromechanical system (MEMS)" is used to encompass a wide range of micromechanical sensors and actuators including those described in the art by the terms "microsystems technology (MST)", "microrobotics" and "microengineered devices".

Conveniently, the oscillatory member is suspended on a substrate. The oscillatory member and/or the substrate may comprise silicon, and may be formed from any one of a silicon-on-insulator (SOI) wafer and a silicon-on-glass (SOG) wafer. Preferably, the oscillatory member is arranged to oscillate along an axis in a plane substantially parallel to the plane of the substrate.

In essence, a magnetic field sensor is provided that has an oscillatory member having two current paths aligned substantially parallel and being operable in gradiometer mode wherein an AC voltage is applied across each current path such that in the presence of a uniform magnetic field the Lorentz force produced by the current flow through each current path is substantially equal and opposite.

According to a second aspect of the invention, a compass is provided that comprises at least one magnetic field sensor device of the first aspect of the invention. In particular, such a compass may comprises a magnetic field sensor device operable in magnetometer and gradiometer modes.

Unlike known compasses in which only magnetic field strength is measured, a compass of the present invention can additionally measure magnetic field gradient. This additional measurement can be used to correct compass bearings for localised magnetic field anomalies. A compass of the present invention can thus be used in various magnetic environments and does not require in-situ calibration, for example using pairs of magnets to counteract the localised magnetic fields, in order to provide an accurate compass reading. The present invention thus provides a highly versatile compass that can be used in harsh and variable magnetic environments.

Advantageously, the compass comprises three magnetic field sensing devices, each of the three magnetic field sensing devices being arranged to acquire magnetic field measurements along mutually orthogonal axes. Furthermore, a processing means may be conveniently provided, the processing means being arranged to switch each magnetic field sensor device between magnetometer mode and gradiometer mode as required and to determine therefrom a compass bearing that is corrected for any localised magnetic field anomalies.

According to a third aspect of the invention, an inertial measurement unit comprises a compass of the second aspect of the invention.

According to a fourth aspect of the invention, a compass comprises means for measuring magnetic field strength and is characterised in that the compass additionally comprises means for measuring magnetic field gradient. The compass may further comprise a processor, the processor being arranged to take magnetic field strength and magnetic field gradient measurements and provide compass bearings corrected for localised magnetic field anomalies.

According to a fifth aspect of the invention, a method of operating a magnetic field sensor device comprises the steps of taking a magnetic field sensor device comprising an oscillatory member and passing an alternating current (AC) through the oscillatory member, characterised in that the oscillatory member comprises at least first and second current paths and in that, during use, an AC is passed along the at least first and second current paths. Advantageously, the method involves passing AC along the first current path in a substantially opposite direction to the second current path.

The invention will now be described, by way of example only, with reference to the following drawings in which.

Figure 1:
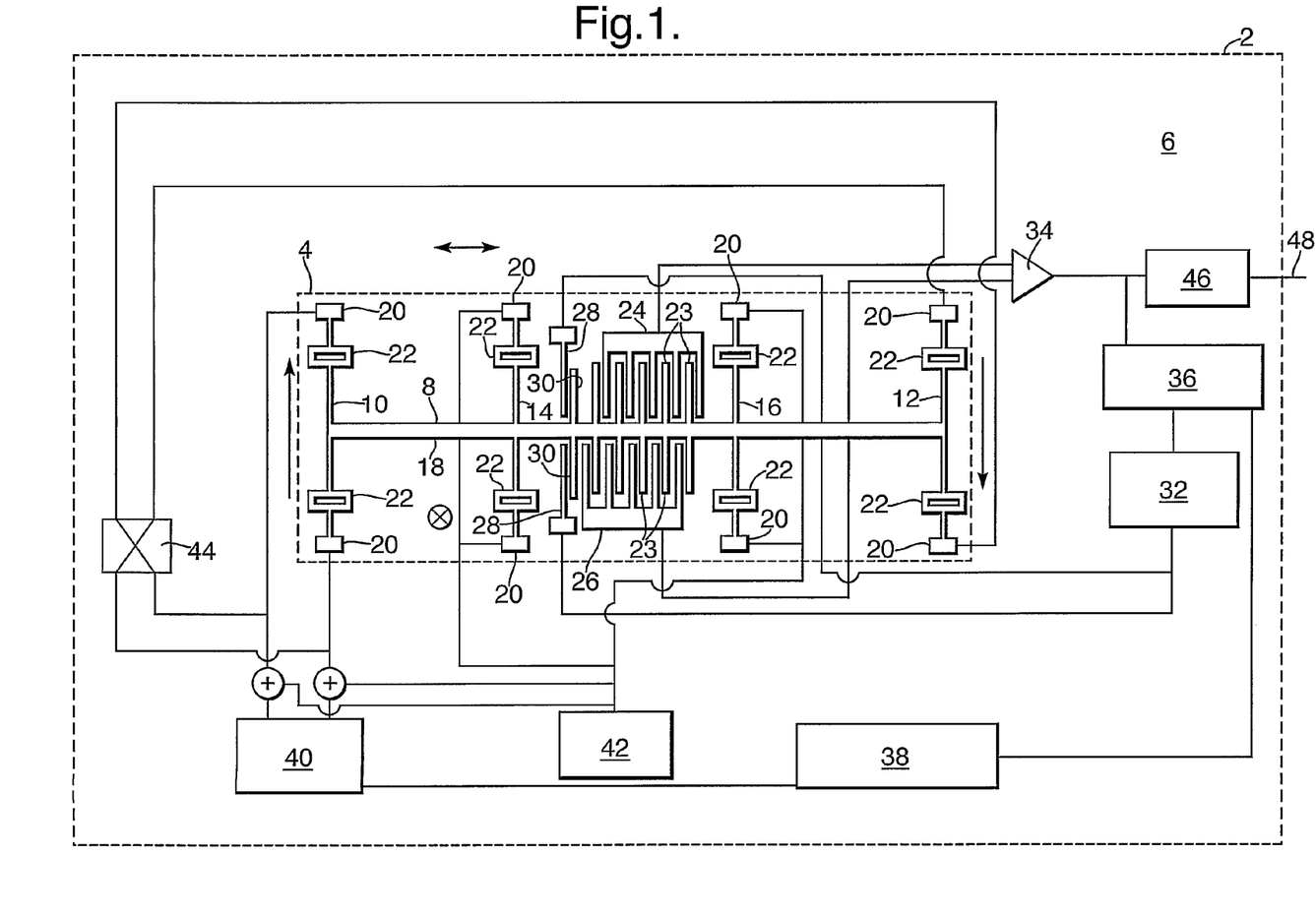
FIG. 1 shows a magnetic field sensor of the present invention.

Referring to FIG. 1, a self-resonant magnetic field sensor 2 is shown. The sensor 2 comprises an active region 4 formed from an SOI substrate and associated control circuitry 6.

The active region 4 comprises a suspended resonant beam structure 8 (i.e. a suspended mass) having a first leg 10, a second leg 12, a third leg 14 and a fourth leg 16. The midpoints of the first to fourth legs 10, 12, 14 and 16 are linked by a cross beam 18. The cross-beam 18 is formed as box section to provide a high degree of stiffness without adding significant amounts of mass. The provision of such a box-section cross-beam prevents the excitation of twisted oscillation modes. The ends of each of the first to fourth legs 10, 12, 14 and 16 are physically attached and electrically connected to the substrate via anchor points 20. Stress relief loops 22 are also formed in the legs in the vicinity of each anchor point to reduce physical stress.

The cross-beam portion 18 of the suspended resonant beam structure 8 carries a plurality of finger electrodes 23 that protrude orthogonally from each side of the cross-beam portion 18 and lie in the plane of the substrate. A first set 24 and a second set 26 of capacitative pick-up finger electrodes are formed in the substrate on either side of the suspended cross-beam portion 18. The device is arranged such that finger electrodes 23 of the suspended cross-beam portion 18 are inter-digitated with the first and second sets 24 and 26 of finger electrodes. The electrode arrangement allows any movement of the suspended resonant beam structure 8 to be sensed capacitively. A pair of driving electrodes 28 are also formed in the substrate, and located in the vicinity of an end pair of finger electrodes 30 carried by the cross-beam portion 18.

In use, the device is preferably operated in so-called "self resonant mode". The suspended resonant beam structure 8 is electrostatically driven to resonate by an electrostatic drive circuit 32 that applies a drive voltage to the pair of driving electrodes 28. Movement of the resonant beam structure is sensed by differential capacitive pick-up using the first and second sets 24 and 26 of finger electrodes. The capacitive pick-off is fed to a differential amplifier 34 and directed, via a 90° phase shifter circuit 36 (or a differentiator circuit), to the electrostatic drive circuit 32. In this manner, a positive electronic feed-back loop arrangement is implemented with the signal generated by capacitative pick-off being used to electrostatically drive the resonant beam structure 8.

The output signal produced by the phase shifter 36 is also fed, via a clipper current drive circuit 38, to a differential drive circuit 40. A polarisation voltage source 42 is also provided. The differential drive circuit is arranged to pass the polarisation voltage (V) plus ΔV to one end of the first leg 10 and the polarisation voltage (V) minus ΔV to the other end of the first leg 10. The voltage outputs of the differential drive circuit 38 are also passed to the ends of the second leg 12 via a cross-over switch 44. The polarisation voltage (V) is applied directly to both ends of the third leg 14 and both ends of the fourth leg 16.

This differential drive arrangement, which is a voltage source circuit, enables a first alternating current (AC) to flow through the first leg 10 and a second AC to flow through the second leg 12. The cross-over switch 44 is arranged such that the ends of the second leg 12 to which the differential drive voltages (i.e. V+ΔV and V−ΔV) are applied can be selected as required. This arrangement ensures that the cross-beam 18 is maintained at a desired polarisation voltage (i.e. at the voltage supplied by the polarisation voltage source 42) which allows low noise capacitative pick-off via the finger electrodes 23. The level of ΔV can be fixed, which potentially introduces uncertainty in the current flow due to variations in the resistance the suspension, or the current can be monitored and ΔV varied to keep the amplitude of the current constant.

The oscillation amplitude of the resonant beam structure oscillation is dependent on the sum of the electrostatic drive forces and the Lorenz forces produced by current flow through the first leg 10 and the second leg 12. In the arrangement shown in FIG. 1, the amplitude of the electrostatic drive is kept constant; i.e. the magnetometer is operated in constant drive mode. The output of the differential amplifier 34, after passing through a rectifier/filter circuit 46, thus provides an output on signal line 48 that is related to the amplitude of motion of the oscillatory member 8.

The magnetic field sensor 2 may be operated as a magnetometer or as a magnetic gradiometer.

In magnetic gradiometer mode, the cross-over switch 44 is arranged such that AC current is passed along the first and second legs 10 and 12 in opposite directions. It should be noted that the direction of current flow of the AC will obviously vary with time. The concept of AC currents flowing in opposite directions would thus be understood by the skilled person to mean that, at a particular point in time, the current flow down the first leg 10 is substantially opposite to the current flow down the second leg 12.

In the presence of a uniform magnetic field, the Lorentz force generated by each current path will be equal and opposite and the Lorentz forces will cancel. In this case, the amplitude of motion will be defined purely by the applied electrostatic drive force. However, if there is a magnetic anomaly nearby then a magnetic field will be generated that has a certain magnetic field gradient (i.e. a magnetic field strength that varies with distance). This will cause the magnitude of the Lorentz force imparted to the first leg to differ to that imparted to the second leg thereby producing a resultant Lorentz force that will increase or decrease the amplitude of motion produced by the electrostatic drive force. In other words, a magnetic field gradient will cause an oscillatory force to be imparted to the resonant beam 8 that is related to the magnetic field gradient.

In magnetometer mode, the cross-over switch 44 is arranged such that current is passed in the same direction along the first leg 10 and the second leg 12. In this case, the oscillatory force imparted to the resonant beam 8 will be dependent on the magnitude of magnetic field strength at the first and second legs. The absolute magnetic field strength can thus be measured. In this mode, the device operated in an analogous manner to the magnetometer described in our International (PCT) patent application PCT/GB2004/004017. It should be noted that rather than providing a cross-over switch 44, a switch may be provided to apply the polarisation voltage to both ends of the second leg 12 when operating in magnetometer mode; the interaction of the current flowing through the first leg and the applied magnetic field strength will then determine the Lorentz force imparted to the resonant beam.

As described above, the sensor may be operated in a constant drive mode in which the electrostatic drive level is selected to be high enough such that the device keeps resonating when the largest magnetic field to be measured (magnetometer mode) or largest magnetic field gradient (magnetic gradiometer mode) is applied. In other words, the resultant force induced by the applied magnetic field and the electrostatic drive should always be sufficiently high to maintain resonance without causing the suspended resonant beam to hit its end stops. It should be noted that even if the applied magnetic field halts resonance or causes the beam to hit its end stops, the device will not normally be damaged and will operate normally again (without requiring re-calibration) when the magnetic field strength/gradient or AC current is reduced.

Instead of operating in a constant drive mode, the sensor may comprise a control loop to vary the amplitude of the electrostatic drive signal in order to keep the amplitude of oscillation constant; i.e. it may operate in constant amplitude mode. The amplitude of the applied drive voltage then provides an indication of the magnetic field strength (magnetometer mode) or the magnetic field gradient (magnetic gradiometer mode) applied to the device.

The capacitive pick off arrangement described above is a so-called displacement current detector. In such an arrangement, the polarisation voltage is fixed at a suitable DC level and the amplifying electronics (e.g. the differential amplifier 34 etc) work at the resonant frequency of the device. For CMOS pick off amplifiers, which would typically be used in an integrated unit or an application specific integrated circuit (ASIC), this operating frequency is within the 1/f noise of the amplifier and the signal to noise ratio of the device will thus be reduced.

To reduce these 1/f noise effects, the capacitance can be sensed using a high frequency (e.g. 1 MHz) probe signal. In this context, "high frequency" means a frequency that is well above the 1/f noise region of the amplifier and also well above the mechanical response of the vibrating structure. The polarisation voltage produced by the polarisation voltage source 42 will be the high frequency probe signal and the output of the capacitive pick-off, after suitable gain, will need demodulating and filtering. The feedback loops for such a system are completed as for the base-band implementation described above, but with a 180° phase shifting means (not shown) replacing the 90° phase shifting circuit 36.

The magnetic sensor of the present invention is well suited for use in a compass system. The compass would preferably comprise three magnetic sensors arranged to measure magnetic field strength (magnetometer mode) and/or the magnetic field gradient (magnetic gradiometer mode) along three mutually orthogonal axes. On short length scales, the Earth's magnetic field is effectively uniform whereas local magnetic anomalies tend to act as point sources and thus have a significant magnetic field gradient. Determining the magnetic field gradient vector from three orthogonal magnetic field gradient measurements would allow, when combined with magnetic field strength measurements, the effect of a magnetic anomaly to be separated from the effect of Earth's magnetic field. In other words, the effect on the compass bearing of a local magnetic anomaly can be corrected using sensors of the present invention to measure both magnetic field strength and magnetic field gradient.

In order to obtain the required quality factor (Q) to operate the sensor as a compass, the sensors are packaged in a reduced pressure environment. The Q factor, which is a measure of the strength of the resonant behavior, is highly dependent on pressure which in turn affects the sensitivity and bandwidth. Another advantage of this device is that it can also be used to directly measure the Q for calibration purposes. If the AC current passed through the beam structure is turned off, then only the electrostatic force imparted by the electrostatic drive circuit 40 via the driving electrodes 28 will act to drive the suspended resonant beam structure 8 into resonance. In such a case, the amplitude of oscillatory motion (or the drive force applied if operating in constant amplitude mode) will be related to the Q.

It may also be advantageous to use two or more equivalent devices simultaneously, one to measure the Q and one as a magnetic sensor. Calibration may also be obtained by the inclusion of a planar coil formed on the wafer around the device. Known currents fed through the planar coil will generate known magnetic fields and/or magnetic field gradient at the device.

Figure 2A:
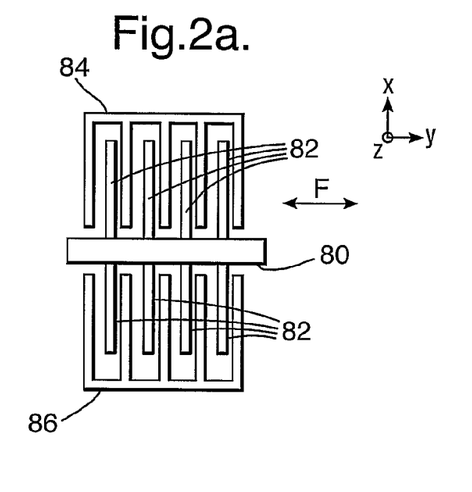
FIG. 2 shows a number of electrode arrangements that can be employed in a MEMS magnetometer of the type shown in FIG. 1.
Figure 2B:
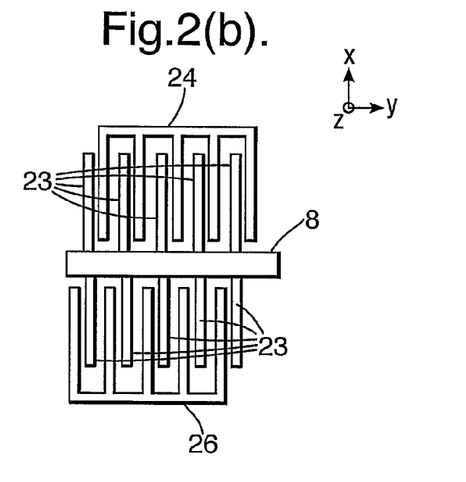
Figure 2C:
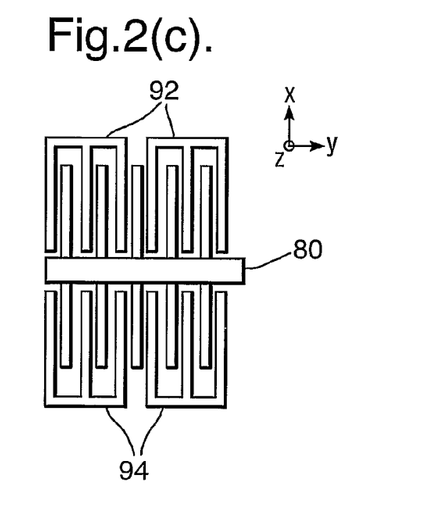

Referring to FIG. 2, a number of alternative capacitive pick-up arrangements that are suitable for inclusion in a magnetometer of the present invention are shown. FIG. 2*b* shows the arrangement employed in the device of FIG. 1, whilst FIGS. 2*a* and 2*c* illustrate alternative arrangements.

FIG. 2*a* illustrates a so-called single ended pick-up arrangement of the type described by Izham et al. A suspended cross beam 80 comprises a number of finger electrodes 82 that interdigitate with two sets of substrate finger electrodes 84 and 86. Movement of the cross beam 80 in the y-direction alters the capacitance of the arrangement and provides an indication of cross beam displacement. A disadvantage of this arrangement is that it is difficult to separate the electrical signal due to beam movement from the driving circuit feed-through and electrical influence of the surrounding electrical circuits The differential pick-up arrangement illustrated in FIG. 2*b* (which is similar to that described with reference to FIG. 1 above) allows measurements to be made with a lower level of associated noise. The cross-beam 8 is located between two sets of finger electrodes 24 and 26 that are laterally off-set relative to one another. Movement of the cross-beam 8 results in the production of a movement induced signal from one set of finger electrodes, say electrodes 24, that is out of phase with the movement induced signal provided by the other set of electrodes 26. In contrast, the noise associated with the signals produced by each of the electrode 24 and 26 is obviously in phase. Consequently, subtracting the signals produced by the electrodes 24 and 26 removes the majority of the unwanted background noise but adds the signals induced by cross-beam movement. It is for this reason that differential pick-up arrangements are preferred.

FIG. 2*c* shows an alternative differential pick-up arrangement in which each of the two sets of finger electrodes 92 and 94 formed in the substrate are split in two. This provides an electrode arrangement that is symmetrical on both sides thereby balancing the electrostatic forces generated by the pick-up circuit to avoid imparting twisting motion.

Figure 3:
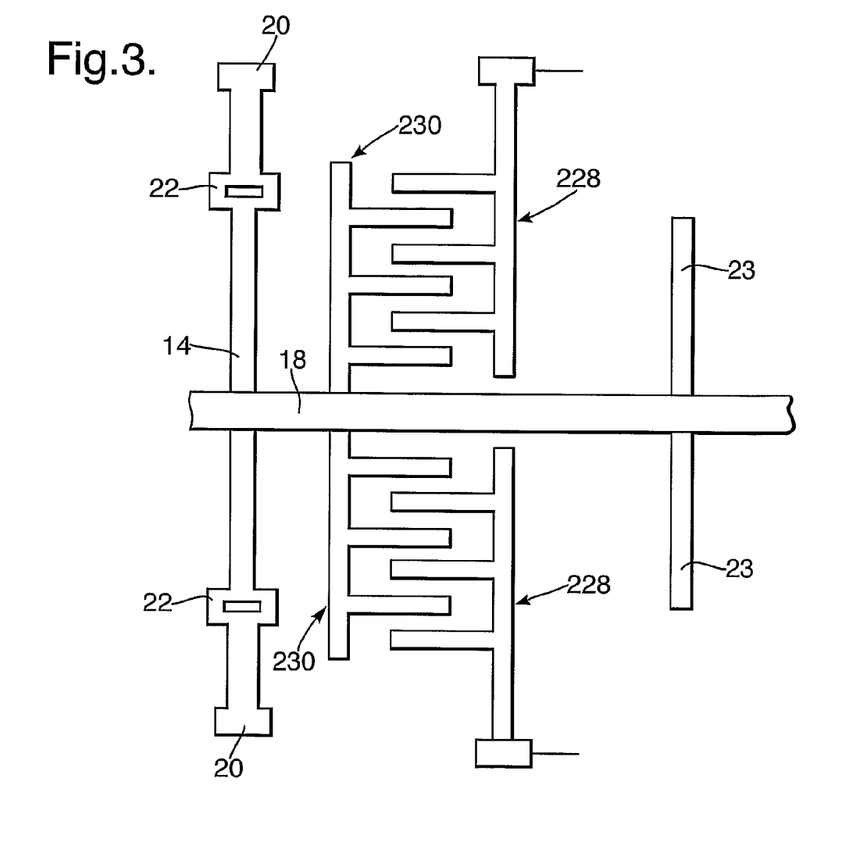
FIG. 3 shows an electrostatic comb drive arrangement that can be employed in a MEMS magnetometer of the type shown in FIG. 1.

It is described above how the suspended resonant beam structure 8 of the device illustrated in FIG. 1 can be driven electrostatically using a pair of driving electrodes 28 formed in the substrate and a corresponding pair of finger electrodes 30 carried by the cross beam 18. FIG. 3 shows a portion of an alternative embodiment in which an electrostatic comb drive arrangement is employed.

In the arrangement of FIG. 3, the cross-beam 18 carries an electrode arrangement 230 that comprises a plurality of finger electrodes. Corresponding driving electrodes 228 are formed on the substrate. The elongate driving electrodes 228 of the substrate interdigitate with the finger electrodes of the electrode arrangement 230 and thus provide an electrostatic comb drive. The comb drive arrangement minimizes the displacement dependence of the applied electrostatic force and also reduces any distortion in the movement of the suspended beam structure 18. The skilled person would also recognize the various alternative driving arrangements that could be used in a device of the present invention.

As described with reference to FIG. 1, a magnetic sensor of the present invention comprises a suspension (i.e. the suspended resonant beam structure 8) that incorporates stress relief loops. Referring now to FIG. 4, two mechanical stress relief arrangements suitable for use in a resonant magnetometer are shown.

Figure 4A:
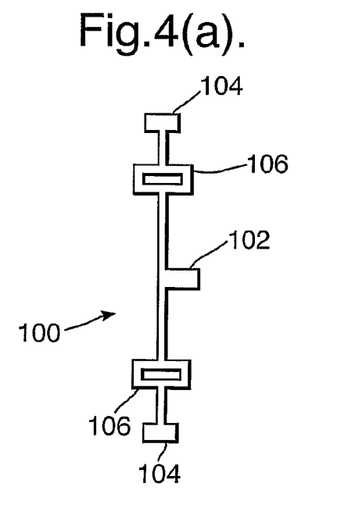
FIG. 4 illustrates the use of folded beams to improve magnetometer performance.

FIG. 4*a* shows a resonant beam 100 supporting a central mass 102 and anchored to the substrate at anchor points 104. Stress relief loops 106 are located at each end of the suspension and form part of the current path through the oscillatory member. The stress relief loops shown in FIG. 4*a* have the dual benefits of providing stress relief without affecting the force induced by the applied magnetic field and also allowing the suspension to operate in a much more linear fashion.

Figure 4B:
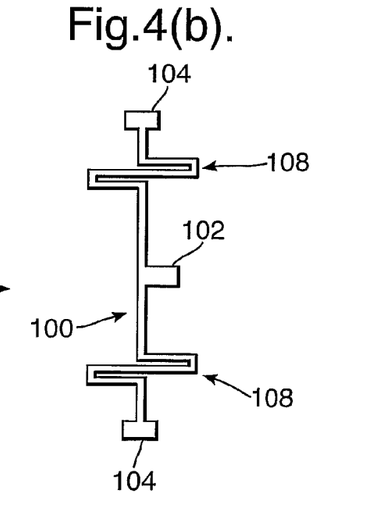

Instead of the loop, a fold 108 can be formed at each end of the resonant beam 100 as shown in FIG. 4b. The folds 108 are arranged such that the distance that the current flows in each direction is equal. This ensures that the Lorentz forces arising due to the interaction of the current flowing along the fold 108 and an applied magnetic field will balance out.

Although various stress relief means have been used previously in MEMS devices, the use of a standard folded suspension would not be suitable because the Lorenz forces would be cancelled out by the current flowing in both directions (i.e. up and down the folds). The formation of stress relief means of the type shown in FIG. 4 has thus solved a number of problems associated with magnetometer devices in general and the device of Izham et al. in particular. Firstly, stress in the substrate can cause the beams to buckle and the device to fail. The stress can be caused by a thermal mismatch between the packaging and the device, and also any residual stress from the manufacturing of the SOI. The stress relief means prevent this buckling from occurring. Secondly, the stiffness of fixed-fixed beams is not linear with amplitude, therefore causing the resonant frequency to change with the amplitude of oscillation. Providing stress relief loops or folds reduces this non-linearity.

Referring to FIG. 5, the manufacture of a device in accordance with the present invention is illustrated.

Figures 5A, 5C:
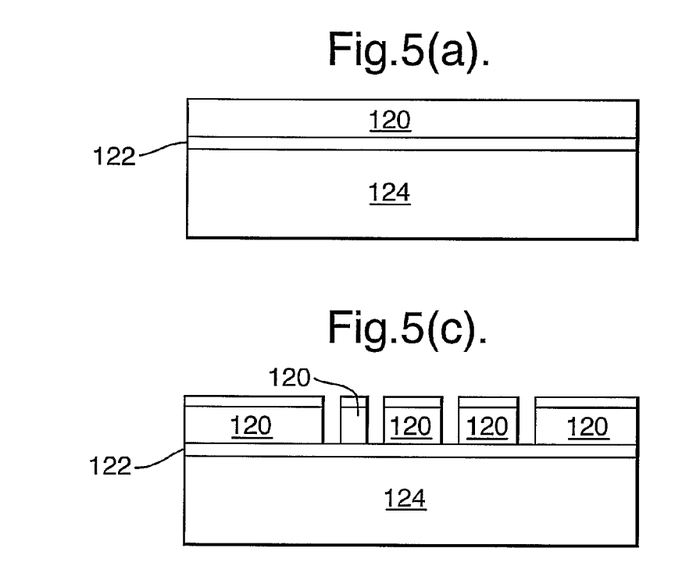
FIG. 5 illustrates how a device of the present invention may be fabricated using an SOI process.
Figure 5B:
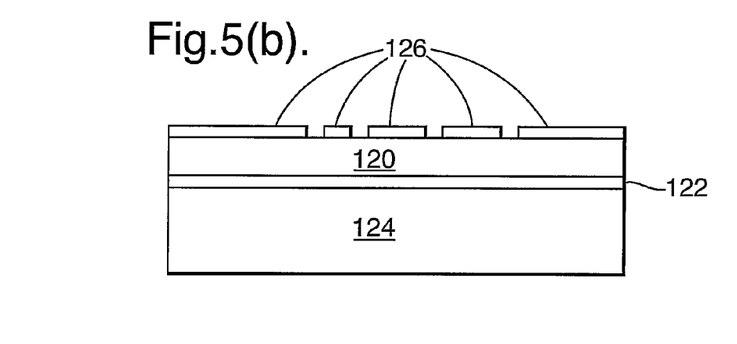
Figure 5D:
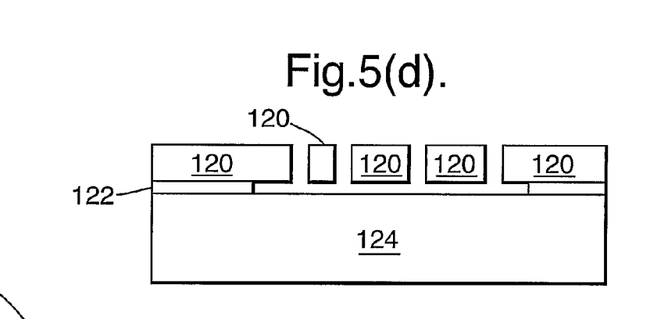
Figure 5E:
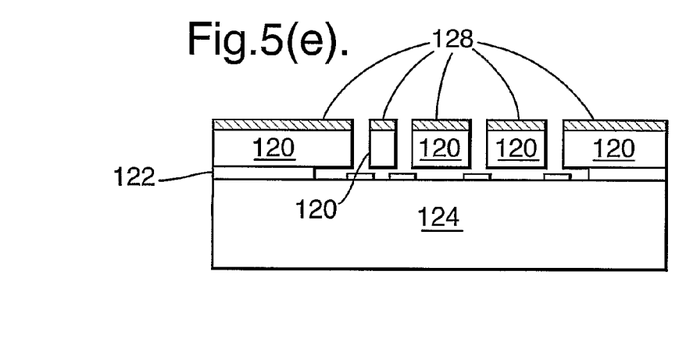

FIG. 5a shows an SOI substrate comprising a mechanical silicon layer 120, a sacrificial oxide layer 122 and a handle wafer 124. As shown in FIG. 5b, a oxide layer 124 is deposited on the silicon layer 120 and etched to defined a mask. Referring to FIG. 5c, it is shown how the mechanical silicon layer 120 is etched through the mask oxide layer 126 down to the sacrificial oxide layer 122. The suspended structure formed in the mechanical silicon layer 120 is then released by removing a portion of the sacrificial oxide as shown in FIG. 5d, before being blanket coated with a metal layer 128 to form the low ohmic conductors seen in FIG. 5e.

The invention claimed is:

1. A magnetic field sensor device comprising:
   an oscillatory member;
   a sensor for providing an output signal dependent on the deflection of the oscillatory member;
   a driver configured to impart a magnetic field independent oscillatory force to the oscillatory member; and
   a current controller, wherein the current controller is arranged to pass an alternating current (AC) along at least first and second current paths provided through the oscillatory member, wherein the current controller is configured to supply a current flow through the first current path that is in substantially the opposite direction to current flow through the second current path to provide magnetic gradiometer mode operation wherein the first and second current paths are arranged to provide counteracting Lorentz forces to the oscillatory member when in the presence of a uniform magnetic field.

2. A device according to claim 1 wherein the current controller is arranged to additionally provide magnetometer mode operation in which current flow through the first current path is in substantially the same direction as current flow through the second current path.

3. A device according to claim 1 wherein the current controller is arranged to additionally provide magnetometer mode operation in which AC is passed through only the first current path.

4. A device according to claim 2 wherein the current controller comprises a mode selector for switching to either one of gradiometer mode and magnetometer mode as required.

5. A compass comprising at least one magnetic field sensor device according to claim 4.

6. A compass according to claim 5 comprising three magnetic field sensing devices, each of the three magnetic field sensing devices being arranged to acquire magnetic field measurements along mutually orthogonal axes.

7. A compass according to claim 6 and further comprising a processor, the processor being arranged to switch each magnetic field sensor device between magnetometer mode and gradiometer mode as required and to determine therefrom a compass bearing that is corrected for any localized magnetic field anomalies.

8. A device according claim 1 wherein the sensor comprises at least one sensor electrode located on a substrate and having a variable capacitance with the oscillatory member.

9. A device according to claim 8 wherein the sensor comprises a plurality of elongate sensor electrodes located on the substrate and the oscillatory member comprises a plurality of elongate electrodes interdigitated with said plurality of elongate sensor electrodes.

10. A device according to claim 9 wherein the electrodes of the oscillatory member are maintained at a predetermined direct current (DC) polarization voltage.

11. A device according to claim 9 wherein a high frequency AC polarisation voltage is applied to the electrodes of the oscillatory member.

12. A device according to claim 9 wherein said plurality of sensor electrodes are electrically connected to form two electrode sets, the two electrode sets being arranged to provide differential capacitive pick-off.

13. A device according to claim 1 wherein the oscillatory member is carried on a substrate and the driver comprises at least one drive electrode formed on the substrate to electrostatically impart the oscillatory force to the oscillatory member.

14. A magnetometer according to claim 13 in which the driver comprises a plurality of first elongate drive electrodes formed on the substrate and the oscillatory member comprises a plurality of second elongate drive electrodes, wherein the first elongate drive electrodes are interdigitated with the second elongate drive electrodes.

15. A device according to claim 1 wherein the driver comprises a positive feedback circuit for receiving the output signal produced by the sensor.

16. A device according to claim 15 wherein the driver provides an oscillatory force of fixed amplitude.

17. A device according to claim 15 in which the driver is arranged to impart an oscillatory force to the oscillatory member of adjustable amplitude, wherein the amplitude of the oscillatory force applied by the driver is adjusted during use so as to maintain a given amplitude of oscillation of the oscillatory member.

18. A device according to claim 1 wherein the frequency of the AC passed through the oscillatory member by the current controller is substantially equal to the resonant frequency of the oscillatory member.

19. A device according to claim 1 wherein the current controller comprises a voltage source for supplying the AC passed through the oscillatory member.

20. A device according to claim 19 wherein the current controller comprises a feedback circuit arranged to receive the output signal produced by the sensor.

21. A device according to claim 1 wherein the first and second current paths of the oscillatory member comprise substantially straight conductive tracks.

22. A device according to claim 21 wherein the conductive track forming the first current path is substantially parallel to the conductive path forming the second current path.

23. A device according to claim 1 wherein the length of the first current path through the oscillatory member is substantially equal to the length of the second current path through the oscillatory member.

24. A device according to claim 1 wherein the first current path through the oscillatory member is spatially separated from the second current path through the oscillatory member by more than 5 mm.

25. A device according to claim 1 wherein the oscillatory member comprises at least first and second flexible leg portions, the first leg portion comprising a conductive portion defining the first current path and the second leg portion comprising a conductive portion defining the second current path.

26. A device according to claim 25 wherein the oscillatory member comprises a substantially rigid cross-beam, a first end of the crossbeam being attached to the first flexible leg portion and the second end of the crossbeam being attached to the second flexible leg portion.

27. A device according to claim 26 wherein one or more additional flexible leg portions are attached to the crossbeam.

28. A device according to claim 26 wherein one or more elongate electrodes protrude from the cross-beam.

29. A device according to claim 26 wherein the cross beam is maintained at a given polarisation voltage during use.

30. A device according to claim 1 wherein the oscillatory member comprises at least one stress reliever.

31. A device according to claim 1 formed as a microelectromechanical system (MEMS).

32. A device according to claim 1 wherein the oscillatory member is suspended on a substrate.

33. A device according to claim 32 wherein the oscillatory member is arranged to oscillate along an axis in a plane substantially parallel to the plane of the substrate.

34. A device according to claim 32 wherein the substrate and oscillatory member are formed from any one of a silicon-on-insulator (SOI) wafer and a silicon-on-glass (SOG) wafer.

35. A compass comprising at least one magnetic field sensor device according to claim 1.

36. An inertial measurement unit comprising a compass according to claim 35.

* * * * *